(12) United States Patent
Matsunaga et al.

(10) Patent No.: US 8,216,648 B2
(45) Date of Patent: Jul. 10, 2012

(54) FILM FORMATION METHOD AND APPARATUS

(75) Inventors: Masanobu Matsunaga, Nirasaki (JP); Keisuke Suzuki, Nirasaki (JP); Jaehyuk Jang, Nirasaki (JP); Pao-Hwa Chou, Nirasaki (JP); Masato Yonezawa, Nirasaki (JP); Masayuki Hasegawa, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/954,778

(22) Filed: Nov. 26, 2010

(65) Prior Publication Data
US 2011/0129619 A1     Jun. 2, 2011

(30) Foreign Application Priority Data
Nov. 27, 2009 (JP) ............................... 2009-269831
Oct. 8, 2010 (JP) ............................... 2010-228615

(51) Int. Cl.
C23C 16/34     (2006.01)
(52) U.S. Cl. ............................ 427/579; 427/569; 427/578
(58) Field of Classification Search .................... None
See application file for complete search history.

(56) References Cited

U.S. PATENT DOCUMENTS

| 2001/0041250 A1* | 11/2001 | Werkhoven et al. | 428/212 |
| 2004/0256664 A1* | 12/2004 | Chou et al. | 257/324 |
| 2008/0311760 A1* | 12/2008 | Nodera et al. | 438/791 |
| 2009/0074984 A1* | 3/2009 | Shimizu et al. | 427/569 |
| 2009/0114156 A1* | 5/2009 | Nodera et al. | 118/725 |

FOREIGN PATENT DOCUMENTS
JP     2006-49809     2/2006

OTHER PUBLICATIONS
U.S. Appl. No. 12/476,734, filed Jun. 2, 2009, Liu Yang et al.

* cited by examiner

Primary Examiner — Timothy Meeks
Assistant Examiner — Joseph Miller, Jr.
(74) Attorney, Agent, or Firm — Oblon, Spivak, McClelland, Maier & Neustadt, L.L.P.

(57) ABSTRACT

A film formation method includes setting a target object at a temperature of 150 to 550° C., the target object being placed inside the process container configured to hold a vacuum state therein, and then, repeating a cycle alternately including a first supply step and a second supply step a plurality of times to form a silicon nitride film on the target object. The first supply step is a step of supplying monochlorosilane gas as an Si source into the process container while setting the process container at a pressure of 66.65 to 666.5 Pa therein. The second supply step is a step of supplying a nitrogen-containing gas as a nitriding gas into the process container.

3 Claims, 10 Drawing Sheets

FILM FORMATION METHOD AND APPARATUS

CROSS-REFERENCE TO RELATED PATENT APPLICATIONS

This application claims the benefit of priority from Japanese Patent Applications No. 2009-269831, filed on Nov. 27, 2009, and No. 2010-228615, filed on Oct. 8, 2010, in the Japan Patent Office, the disclosure of which is incorporated herein in the entirety by reference.

BACKGROUND OF THE INVENTION

1. Field of the Invention

The present invention relates to a film formation method and apparatus for forming a silicon nitride film (SiN film) on a target object, such as a semiconductor wafer, and particularly relates to a semiconductor process technique. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In the manufacturing sequence of semiconductor devices, there is used a film formation process for forming a silicon nitride film (SiN film) as an insulating film on a semiconductor wafer, such as a silicon wafer. In such SiN film formation processes, a vertical heat processing apparatus of the batch type is often used to perform film formation by chemical vapor deposition (CVD) on a plurality of semiconductor wafers together at a time.

In recent years, owing to the demands for increased miniaturization and integration of semiconductor devices, it has been required to form an SiN film of higher quality by use of a film formation temperature lower than that of conventional CVD. As a technique for fulfilling the demands in vertical heat processing apparatuses of the batch type, there has been proposed a technique for forming an SiN film by ALD (atomic layer deposition) that alternately supplies an Si source gas and a nitriding gas to repeat lamination of films of an atomic layer level or molecular layer level (for example, Jpn. Pat. Appln. KOKAI Publication No. 2006-49809). For example, dichlorosilane (DCS: $SiH_2Cl_2$), which has a high adsorbent property, is used as the Si source, and ammonia ($NH_3$) is used as the nitriding gas.

BRIEF SUMMARY OF THE INVENTION

It has been found that, where an SiN film is formed at a temperature of 500° C. or less by ALD using DCS as the Si source, the SiN film renders a very high wet etching rate, i.e., a low film quality.

An object of the present invention is to provide a film formation method and apparatus that can form a silicon nitride film of higher quality by ALD.

In the process of developing the present invention, the inventors made assiduous studies to solve the problem described above, and have arrived at the findings given below. Specifically, where an SiN film is formed at a temperature of 150 to 550° C. by ALD using monochlorosilane (MCS: $SiH_3Cl$), which is capable of being nitrided more easily than DCS, as the Si source, the SiN film renders a better film quality. In this respect, U.S. patent application Ser. No. 12/476,734 discloses a technique for forming an SiN film by use of monochlorosilane as the Si source.

According to a first aspect of the present invention, there is provided a film formation method comprising: setting a target object at a temperature of 150 to 550° C., the target object being placed inside the process container configured to hold a vacuum state therein; and then, repeating a cycle alternately including a first supply step and a second supply step a plurality of times to form a silicon nitride film on the target object, the first supply step being a step of supplying monochlorosilane gas as an Si source into the process container while setting the process container at a pressure of 66.65 to 666.5 Pa therein, and the second supply step being a step of supplying a nitrogen-containing gas as a nitriding gas into the process container.

According to a second aspect of the present invention, there is provided a film formation method for forming a silicon nitride film on a plurality of target objects placed at intervals in a vertical direction inside a process container configured to be selectively supplied with monochlorosilane gas and a nitrogen-containing gas serving as a nitriding gas, the method repeating a cycle a plurality of times to laminate thin films respectively formed by the plurality of times, thereby forming the silicon nitride film with a predetermined thickness, the cycle comprising: a first supply step of supplying the monochlorosilane gas into the process container by spouting the monochlorosilane gas in horizontal directions from a plurality of gas spouting holes formed on a first nozzle extending vertically without supplying the nitrogen-containing gas into the process container, thereby forming a layer derived from the monochlorosilane gas and adsorbed on a surface of the target objects; then a first purge step of exhausting gas from inside the process container without supplying either of the monochlorosilane gas and the nitrogen-containing gas into the process container; then an second supply step of supplying the nitrogen-containing gas into the process container by spouting the nitrogen-containing gas in horizontal directions from a plurality of gas spouting holes formed on a second nozzle extending vertically without supplying the monochlorosilane gas into the process container, thereby nitriding the layer adsorbed on the surface of the target objects; and then a second purge step of exhausting gas from inside the process container without supplying either of the monochlorosilane gas and the nitrogen-containing gas into the process container; wherein the target objects are set at a temperature of 150 to 550° C. during the cycle, the process container is set at a pressure of 66.65 to 666.5 Pa therein during the first supply step, and the second supply step includes turning the nitrogen-containing gas into plasma by a plasma generating mechanism disposed on a sidewall of the process container while supplying the nitrogen-containing gas into the process container, thereby using the nitrogen-containing gas thus excited to nitride the layer adsorbed on the surface of the target objects.

According to a third aspect of the present invention, there is provided a film formation apparatus for forming a silicon nitride film on a plurality of target objects, the apparatus comprising: a vertical process container configured to hold a vacuum state therein; a holder configured to hold the target objects at intervals in a vertical direction inside a process container; a heating mechanism disposed around the process container to heat the target objects; an Si source gas supply mechanism configured to supply monochlorosilane gas as an Si source into the process container; a nitrogen-containing gas supply mechanism configured to supply a nitrogen-containing gas as a nitriding gas into the process container; and a control section configured to control an operation of the apparatus, wherein the control section is preset to perform a film formation method, which includes setting a target object at a temperature of 150 to 550° C., the target object being placed inside the process container configured to hold a vacuum state therein; and then, repeating a cycle alternately including a first supply step and a second supply step a plurality of times to form a silicon nitride film on the target object, the first supply step being a step of supplying the monochlorosilane gas into the process container while setting the process container at a pressure of 66.65 to 666.5 Pa therein, and the second supply step being a step of supplying the nitrogen-containing gas into the process container.

According to a fourth aspect of the present invention, there is provided a computer readable non-transitory storage medium containing a program for execution on a computer, which is used for a film formation apparatus, wherein the program, when executed by the computer, causes the computer to control the film formation apparatus to conduct a film formation method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
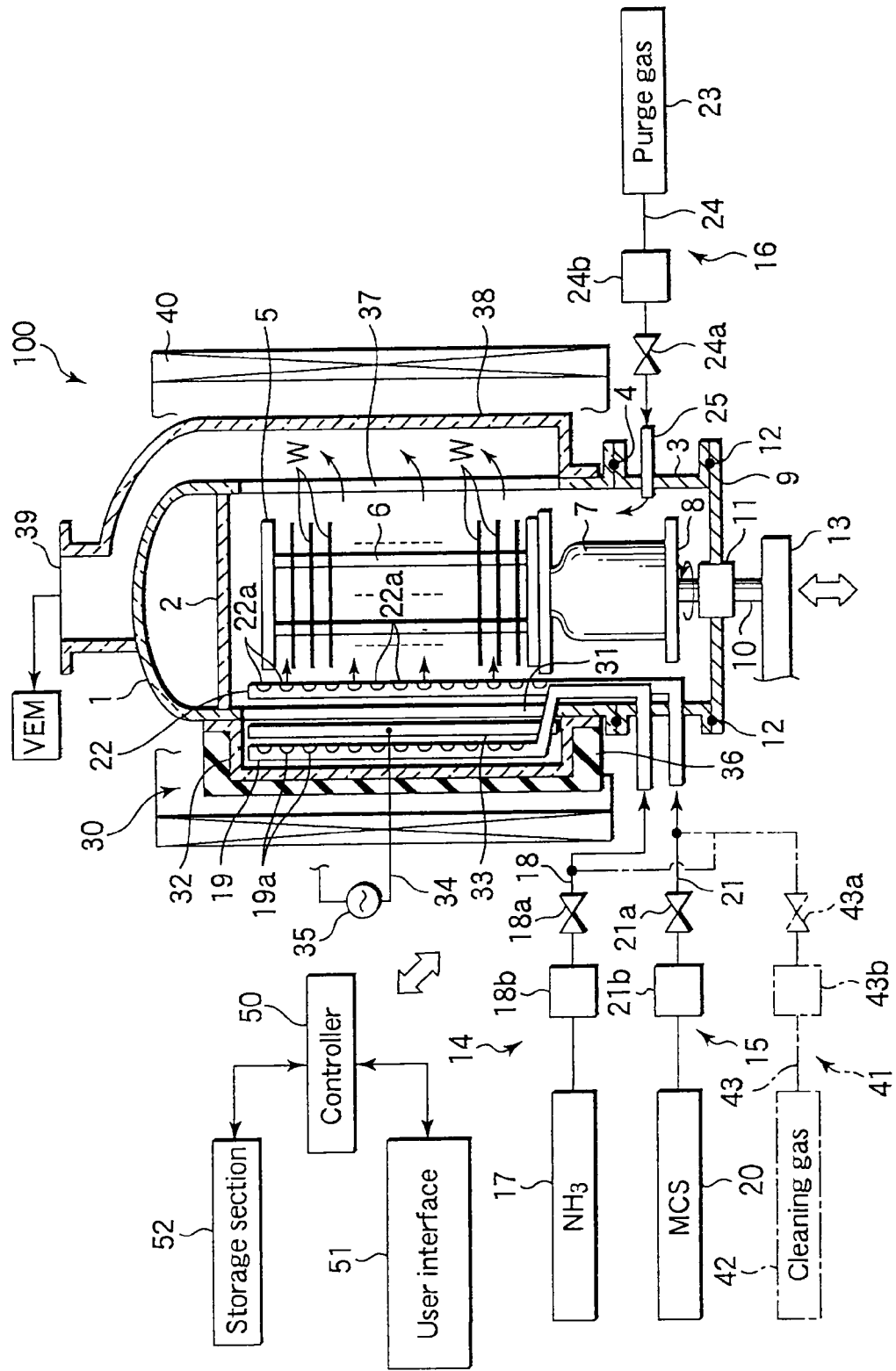
FIG. 1 is a sectional front view showing a film formation apparatus for a semiconductor process according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

FIG. 1 is a sectional front view showing a film formation apparatus for a semiconductor process according to an embodiment of the present invention.

Figure 2:
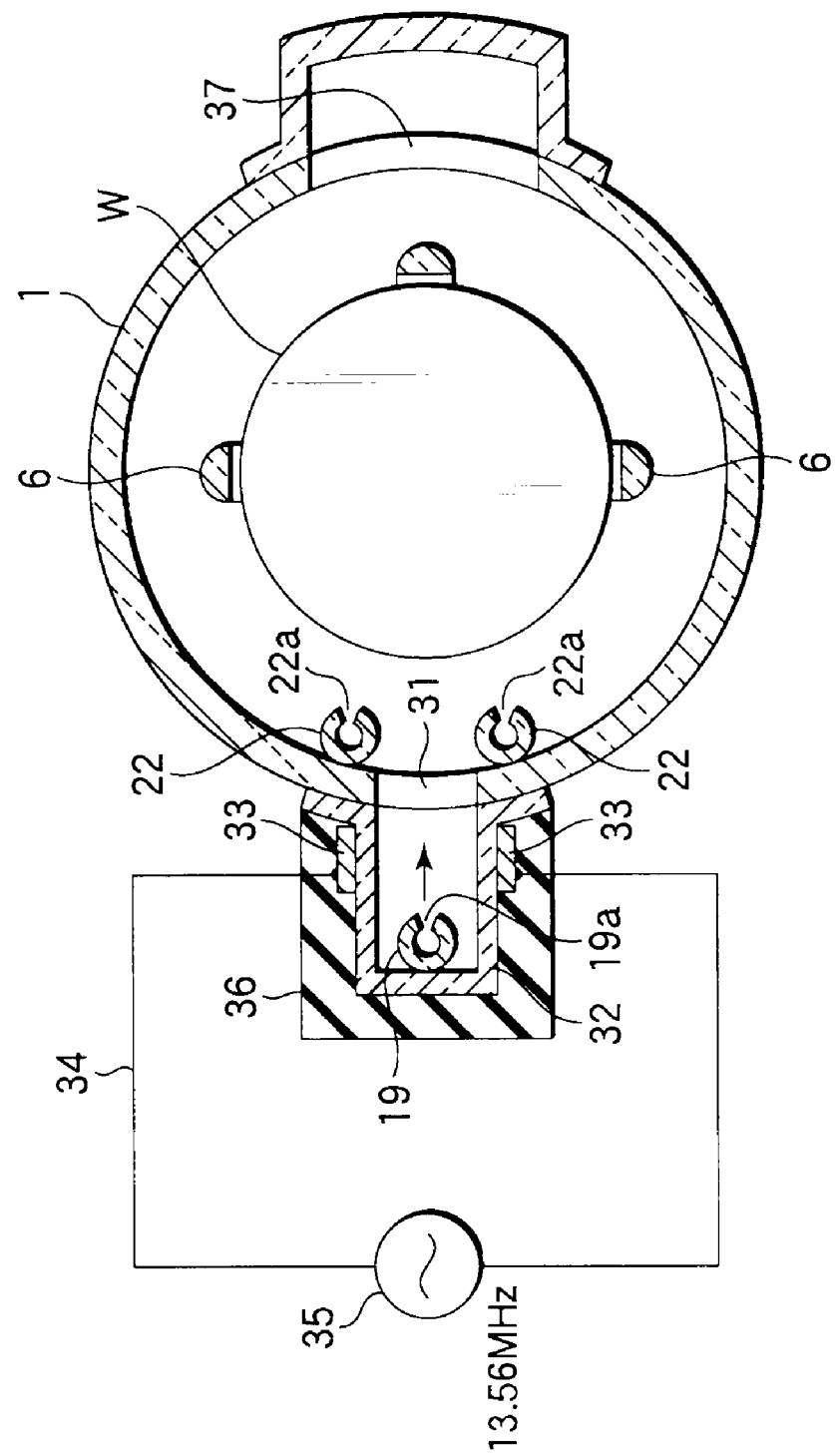
FIG. 2 is a sectional plan view showing part of the film formation apparatus shown in FIG. 1.

FIG. 2 is a sectional plan view showing part of the film formation apparatus shown in FIG. 1. In FIG. 2, a heating mechanism is not shown.

The film formation apparatus 100 includes a process container 1 shaped as a cylindrical column with an opened bottom and closed top. The entirety of the process container 1 is made of, e.g., quartz. The process container 1 is equipped with a quartz ceiling plate 2 disposed therein near the top to airtightly seal the area below the ceiling plate 2. The opened bottom of the process container 1 is connected through a seal member 4, such as an O-ring, to a cylindrical manifold 3 made of, e.g., stainless steel.

The manifold 3 supports the bottom of the process container 1. A wafer boat 5 made of quartz is moved up and down through the bottom port of the manifold 3, so that the wafer boat 5 is loaded/unloaded into and from the process container 1. A number of, such as about 50 to 100, target objects or semiconductor wafers W are stacked on a wafer boat 5. The wafer boat 5 has three struts 6 (see FIG. 2) with grooves on which a number of wafers W are respectively supported.

The wafer boat 5 is placed on a table 8 through a heat-insulating cylinder 7 made of quartz. The table 8 is supported by a rotary shaft 10, which penetrates a lid 9 made of, e.g., stainless steel, and used for opening/closing the bottom port of the manifold 3.

The portion of the lid 9 where the rotary shaft 10 penetrates is equipped with, e.g., a magnetic-fluid seal 11, so that the rotary shaft 10 is rotatably supported in an airtightly sealed state. A seal member 12, such as an O-ring, is interposed between the periphery of the lid 9 and the bottom of the manifold 3, so that the interior of the process container 1 can be kept sealed.

For example, the rotary shaft 10 is attached at the distal end of an arm 13 supported by an elevating mechanism (not shown), such as a boat elevator. The elevating mechanism moves the wafer boat 5 and lid 9 up and down in unison into and from the process container 1. The table 8 may be fixed to the lid 9, so that wafers W are processed without rotation of the wafer boat 5.

The film formation apparatus 100 includes a nitrogen-containing gas supply mechanism 14, an Si source gas supply mechanism 15, and a purge gas supply mechanism 16. The nitrogen-containing gas supply mechanism 14 is arranged to supply a nitrogen-containing gas, such as ammonia ($NH_3$) gas, into the process container 1. The Si source gas supply mechanism 15 is arranged to supply an Si source gas consisting of monochlorosilane (MCS) gas into the process container 1. The purge gas supply mechanism 16 is arranged to supply an inactive gas, such as nitrogen ($N_2$) gas, serving as a purge gas into the process container 1.

The nitrogen-containing gas supply mechanism 14 includes a nitrogen-containing gas supply source 17 and a gas distribution nozzle 19 connected to each other through a gas line 18 for supplying the nitrogen-containing gas. The gas distribution nozzle 19 is formed of a quartz pipe that penetrates the sidewall of the manifold 3 from outside and then turns and extends vertically upward. The vertical portion of the gas distribution nozzle 19 has a plurality of gas spouting holes 19a formed thereon at predetermined intervals over the vertical length corresponding to the wafer supporting span of the wafer boat 5. Consequently, the nitrogen-containing gas, such as $NH_3$ gas, is almost uniformly spouted in horizontal directions from the gas spouting holes 19a toward the process container 1.

The Si source gas supply mechanism 15 includes an Si source gas supply source 20 and a gas distribution nozzles 22 connected to each other through a gas line 21 for supplying the Si source gas. In this embodiment, there are two gas distribution nozzles 22 for the Si source gas (see FIG. 2). Each of the gas distribution nozzles 22 is formed of a quartz pipe that penetrates the sidewall of the manifold 3 from outside and then turns and extends vertically upward. The vertical portion of each of the gas distribution nozzles 22 also has a plurality of gas spouting holes 22a formed thereon at predetermined intervals over the vertical length corresponding to the wafer supporting span of the wafer boat 5. Consequently, the Si source gas consisting of MCS gas is almost uniformly spouted in horizontal directions from the gas spouting holes 22a toward the process container 1. Only one gas distribution nozzle 22 may be disposed for the Si source gas.

The purge gas supply mechanism 16 includes a purge gas supply source 23 and a gas nozzle 25 connected to each other through a gas line 24 for supplying the purge gas. The gas nozzle 25 is formed of a short quartz pipe that penetrates the sidewall of the manifold 3 from outside. An inactive gas, such as $N_2$ gas, is preferably used as the purge gas.

The gas lines 18, 21, and 24 are respectively equipped with switching valves 18a, 21a, and 24a and flow rate controllers 18b, 21b, and 24b, such as mass flow controllers. Consequently, the nitrogen-containing gas, Si source gas, and purge gas can be supplied at controlled flow rates.

A plasma generating mechanism 30 is formed on a part of the sidewall of the process container 1 for generating plasma of the nitrogen-containing gas serving as a nitriding gas. The plasma generating mechanism 30 has a vertically long narrow opening 31 formed by cutting a predetermined width of the sidewall of the process container 1 in the vertical direction. The opening 31 is covered with a plasma cover wall 32 airtightly connected to the outer surface of the process container 1 by welding. The plasma cover wall 32 is formed of, e.g., quartz and has a vertical long narrow shape with a concave cross-section.

A pair of long narrow plasma electrodes 33 are disposed on the opposite outer surfaces of the plasma cover wall 32, and face each other while extending in the vertical direction. The plasma electrodes 33 are connected to an RF (Radio Frequency) power supply 35 for supplying an RF power through feed lines 34. An RF voltage of, e.g., 13.56 MHz is applied from the power supply 35 to the plasma electrodes 33 to generate plasma of the nitrogen-containing gas. The frequency of the RF voltage is not limited to 13.56 MHz, and it may be set at another frequency, e.g., 400 kHz.

The plasma cover wall 32 described above is formed such that the sidewall of the process container 1 projects outward to define an inner concave, while the inner space of the plasma cover wall 32 communicates with the inner space of the process container 1. The inner space of the plasma cover wall 32 and the opening 31 have a vertical length sufficient to cover all the wafers W on the wafer boat 5 in the vertical direction.

The gas distribution nozzle 19 for the nitrogen-containing gas is bent outward in the radial direction of the process container 1 while it extends upward inside the process container 1. Then, the gas distribution nozzle 19 vertically extends at the deepest position (the farthest position from the center of the process container 1) inside the plasma cover wall 32. For example, when the RF power supply 35 is turned on and an RF electric field is thereby generated between the two electrodes 33, the nitrogen-containing gas, such as $NH_3$ gas, spouted from the gas spouting holes 19a of the gas distribution nozzle 19 is turned into plasma and is supplied and diffused toward the center of the process container 1.

An insulating protection cover 36 made of, e.g., quartz is attached on and covers the outer surface of the plasma cover wall 32. A coolant passages (not shown) are formed inside the insulating protection cover 36 and can be supplied with a coolant, such as cooled nitrogen gas, to cool the plasma electrodes 33.

The two gas distribution nozzles 22 extend upward at the opposite positions sandwiching the opening 31 inside the sidewall of the process container 1. The Si source gas consisting of MCS gas is spouted from the gas spouting holes 22a of the gas distribution nozzles 22 toward the center of the process container 1.

On the other hand, on the side of the process container 1 opposite to the opening 31, the process container 1 has an exhaust port 37 formed thereon for vacuum-exhausting the interior of the process container 1. The exhaust port 37 has a long narrow shape formed by cutting the sidewall of the process container 1 in the vertical direction. The exhaust port 37 is covered with an exhaust port cover member 38 having a U-shape cross-section and attached to the process container 1 by welding. The exhaust port cover member 38 extends upward along the sidewall of the process container 1, and has a gas outlet 39 at the top of the process container 1. The gas outlet 39 is connected to a vacuum-exhaust mechanism VEM including a vacuum pump and so forth. The process container 1 is surrounded by a cylindrical heating mechanism 40 for heating the atmosphere and wafers W inside the process container 1.

The film formation apparatus 100 includes a controller 50 comprising a microprocessor (computer), which controls the respective components in the film formation apparatus 100. For example, the controller 50 controls the valves 18a, 21a, and 24a to supply/stop the gases by opening/closing them, the mass flow controllers 18b, 21b, and 24b to adjust the flow rates of the gases, the vacuum-exhaust mechanism to exhaust gas, the RF power supply 35 to turn on/off an RF power, and the heating mechanism 40 to adjust the temperature of the wafers W. Accordingly, the controller 50 serves as a gas supply control mechanism, a temperature control mechanism, and so forth. The controller 50 is connected to the user interface 51, which includes, e.g., a keyboard and a display, wherein the keyboard is used for an operator to input commands for operating the film formation apparatus 100, and the display is used for showing visualized images of the operational status of the film formation apparatus 100.

Further, the controller 50 is connected to a storage section 52 that stores recipes, i.e., control programs for the controller 50 to control the film formation apparatus 100 so as to perform various processes, and control programs for the respective components of the film formation apparatus 100 to perform processes in accordance with process conditions. The recipes are stored in a storage medium included in the storage section 52. The storage medium may be formed of a medium of the stationary type, such as a hard disk or semiconductor memory, or a medium of the portable type, such as a CD-ROM, DVD, or flash memory. Alternatively, the recipes may be used online while they are transmitted from another apparatus through, e.g., a dedicated line, as needed.

A required recipe is retrieved from the storage section 52 and executed by the controller 50 in accordance with an instruction or the like input through the user interface 51. Consequently, the film formation apparatus 100 can perform a predetermined process in accordance with the retrieved recipe under the control of the controller 50.

Figure 3:
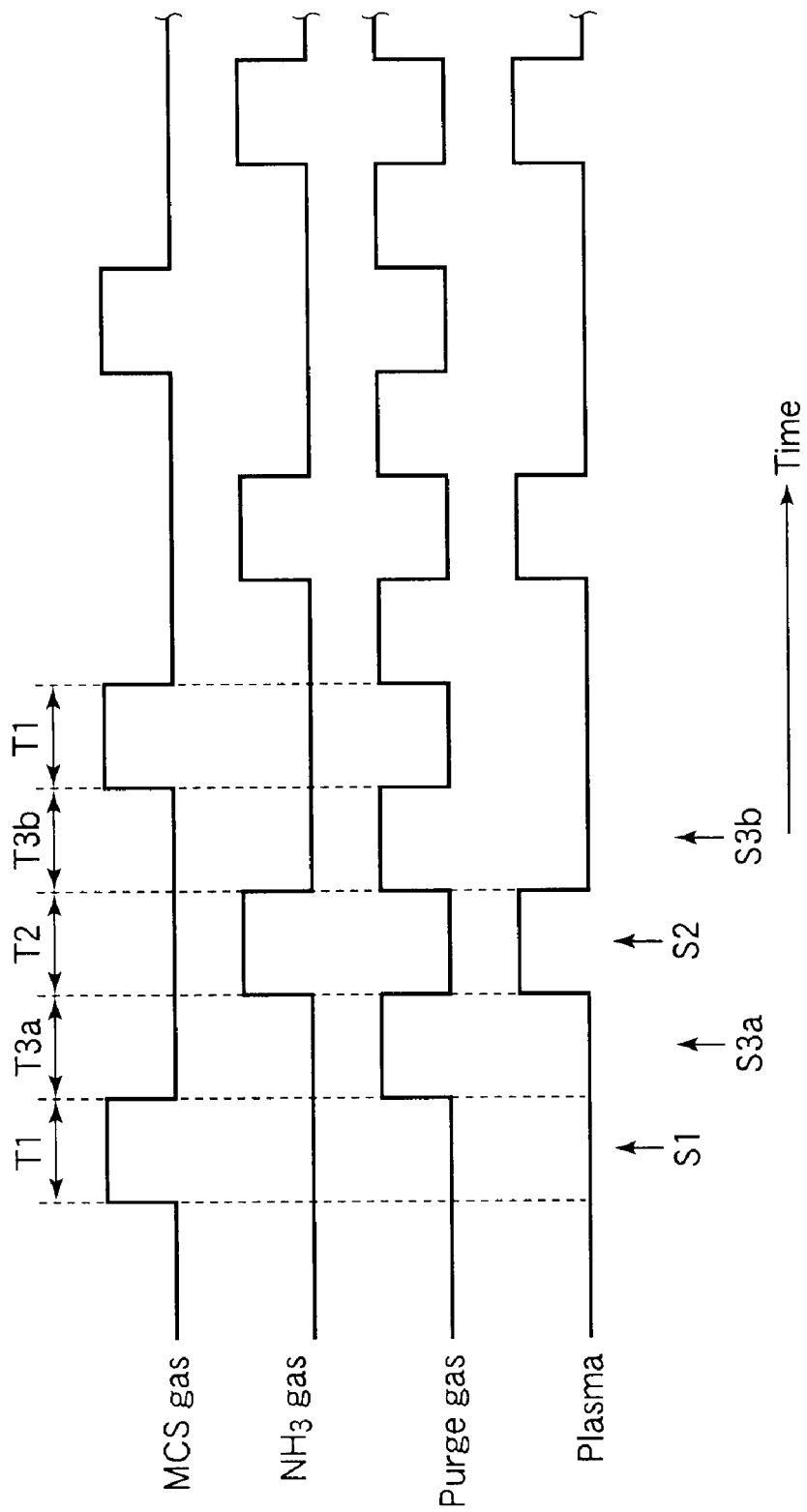
FIG. 3 is a timing chart showing the gas supply timing of a film formation method according to an embodiment of the present invention.

Next, with reference to FIG. 3, an explanation will be given of a film formation method for an SiN film according to an embodiment performed in the film formation apparatus having the structure described above. FIG. 3 is a timing chart showing the gas supply timing of a film formation method according to an embodiment of the present invention.

At first, the wafer boat 5 at room temperature, which supports a number of, such as 50 to 100, semiconductor wafers W, is loaded from below into the process container 1 adjusted to a predetermined temperature in advance. Then, the bottom port of the manifold 3 is closed by the lid 9 to set an airtight space inside the process container 1. For example, the semiconductor wafers W have a diameter of 300 mm, although not limited thereto.

Then, the interior of the process container 1 is vacuum-exhausted and kept at a predetermined process pressure. Further, the electric power applied to the heating mechanism 40 is controlled to increase and set the wafer temperature to a process temperature. Then, while the wafer boat 5 is rotated, the film formation process is started.

Figure 6:
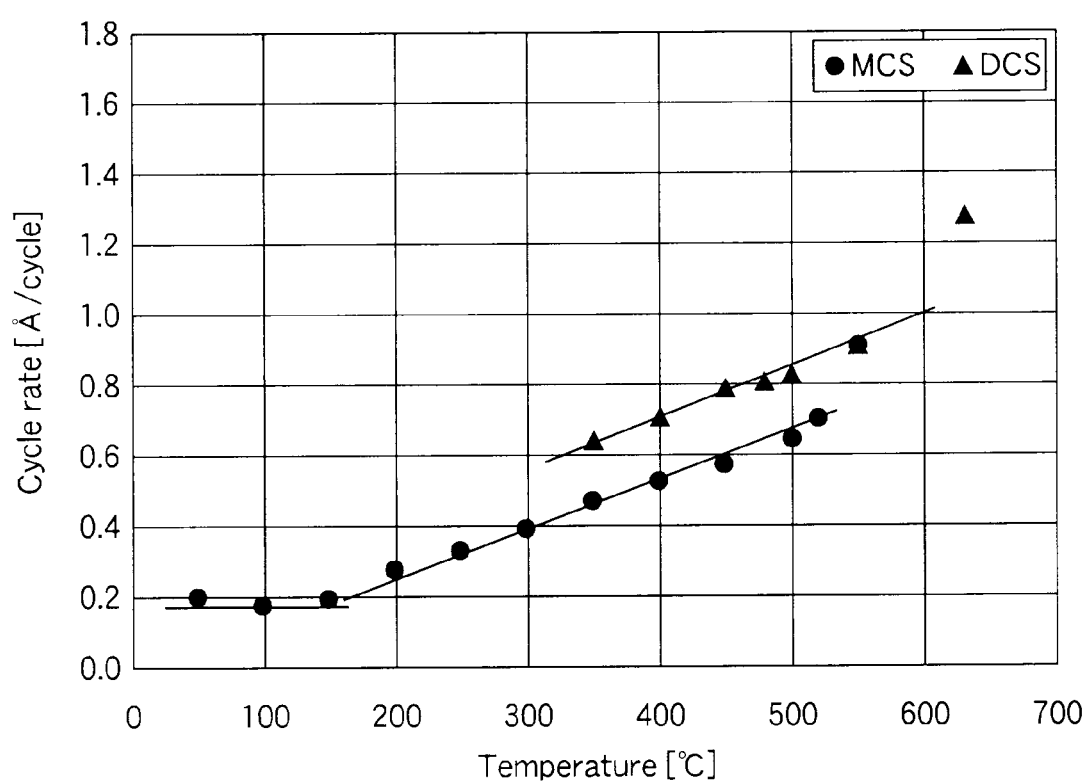
FIG. 6 is a graph showing the relationship of cycle rates relative to the film formation temperature in cases where MCS and DCS were respectively used as the Si source.

As shown in FIG. 6, this film formation process is performed by so-called plasma ALD that alternately repeats a step S1 and a step S2. The step S1 is arranged to supply the Si source gas or MCS gas into the process container 1 to adsorb this gas on the wafers W. The step S2 is arranged to supply the nitriding gas or nitrogen-containing gas, such as $NH_3$ gas, excited by plasma into the process container 1 to nitride the Si source gas adsorbed on the wafers W. Steps S3a and S3b are interposed between the steps 1 and 2 to remove residual gas from inside the process container 1.

Specifically, in the step S1, the Si source gas or MCS gas is supplied from the gas supply source 20 of the Si source gas supply mechanism 15 through the gas line 21 and gas distribution nozzles 22 and is spouted from the gas spouting holes 22a into the process container 1 for a time period T1. Consequently, the MCS is adsorbed on each of the semiconductor wafers. The time period T1 of this step is set to be, e.g., 2 to 30 sec. The flow rate of the Si source gas is set to be, e.g., 1 to 5 L/min (slm). The pressure inside the process container 1 is set to be, e.g., 66.65 to 666.5 Pa (0.5 to 5 Torr), and preferably to be 266.6 to 600 Pa (2 to 4.5 Torr).

In the step S2, the nitrogen-containing gas, such as $NH_3$ gas, is supplied from the gas supply source 17 of the nitrogen-containing gas supply mechanism 14 through the gas supply line 18 and gas distribution nozzle 19 and is spouted from the gas spouting holes 19a. At this time, the RF power supply 35 of the plasma generating mechanism 30 is set in the ON-state to generate an RF electric field, by which the nitrogen-containing gas, such as $NH_3$ gas, is turned into plasma. The nitrogen-containing gas thus plasma-excited is then supplied into the process container 1. Consequently, the MCS adsorbed on the semiconductor wafers W is nitrided and turned into SiN. The time period T2 of this step is set to be, e.g., 5 to 120 sec. The flow rate of the nitrogen-containing gas is set to be, e.g., 0.5 to 10 L/min (slm) for $NH_3$ gas, although it depends on the number of semiconductor wafers W supported on the wafer boat 5. The RF power supply 35 is set to apply an RF power with, e.g., a frequency of 13.56 MHz, and a power of 5 to 1,000 W, and preferably of 10 to 200 W, although they are not limited to specific values. The pressure inside the process container 1 is set to be, e.g., 13.33 to 266.6 Pa (0.1 to 2 Torr), and preferably to be 13.33 to 120 Pa (0.1 to 0.93 Torr).

In this step, the nitrogen-containing gas may be $N_2$ gas or $N_2H_4$ gas in place of $NH_3$ gas, and this alternative gas is also turned into plasma by the RF electric field when used as a nitriding agent.

The steps S3a and S3b interposed between the step S1 and step S2 are used to remove the residual gas from inside the process container 1 after the step S1 or step S2, to cause a desired reaction in the subsequent step. Specifically, in these steps, while the process container 1 is vacuum-exhausted, an inactive gas, such as $N_2$ gas, serving as a purge gas is supplied from the gas supply source 23 of the purge gas supply mechanism 16 through gas line 24 and gas nozzle 25 into the process container 1. The each of the time periods T3a and T3b of these steps S3a and S3b is set to be, e.g., 2 to 15 sec. The flow rate of the purge gas is set to be, e.g., 0.5 to 15 L/min (slm). Each of the steps S3a and S3b may be arranged to continuously vacuum-exhaust the process container 1 without supplying the purge gas, i.e., without performing the supply of any of the gases, if the residual gas can be removed from inside the process container 1. However, supplying the purge gas shortens the time necessary for removing the residual gas from inside the process container 1.

As described above, the step S1 of supplying the Si source gas or MCS gas and the step S2 of supplying nitrogen-containing gas excited by plasma are alternately repeated with the steps S3a and S3b of removing the residual gas from inside the process container 1 interposed therebetween. Consequently, thin SiN layers are repeatedly laminated one by one to complete a SiN film having a predetermined thickness. The number of repetition of this cycle is suitably determined in accordance with the thickness of the completed SiN film.

The wafer temperature (film formation temperature) used in the film formation is defined by an upper limit temperature above which it is difficult to realize the ALD and a lower limit temperature below which it is difficult to form a film of high quality by the ALD. Specifically, the film formation temperature is set to fall within a range of 150 to 550° C.

Next, explanations will be given of experiments conducted by performing plasma ALD film formation in the apparatus shown in FIG. 1. At first, the film formation temperature will be explained in detail.

Film formation of an SiN film was performed while MCS and DCS were respectively used as the Si source. In the experiments, the film formation temperature was set at different values but the plasma generation time period was set constant. The SiN films thus formed were examined in terms of properties described below with reference to FIGS. 4 to 9.

Figure 4:
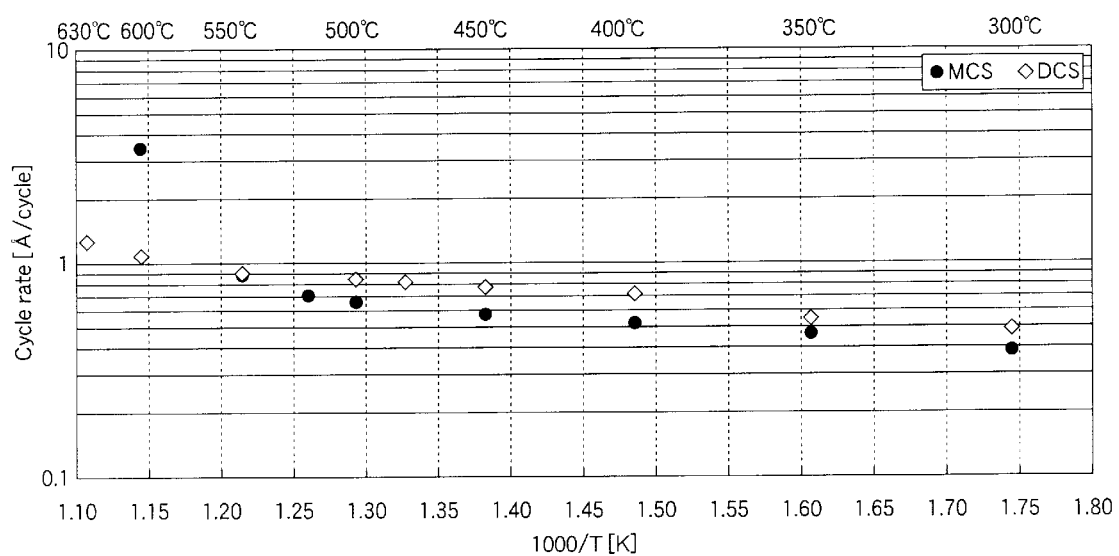
FIG. 4 is a graph showing the relationship of film formation rates per cycle (cycle rate) expressed in logarithm relative to 1000/T(K) in cases where MCS and DCS were respectively used as the Si source.

FIG. 4 is a graph showing the relationship of film formation rates per cycle (cycle rate) expressed in logarithm relative to 1000/T(K) in cases where MCS and DCS were respectively used as the Si source. In FIG. 4, the horizontal axis denotes 1000/T(K) and the vertical axis denotes the cycle rate expressed in logarithm. As regards the plot points in FIG. 4, the DCS group consists of 630° C., 600° C., 550° C., 500° C., 480° C., 450° C., 400° C., 350° C., and 300° C., and the MCS group consists of 600° C., 520° C., 500° C., 450° C., 400° C., 350° C., and 300° C., from the high temperature side.

Figure 5:
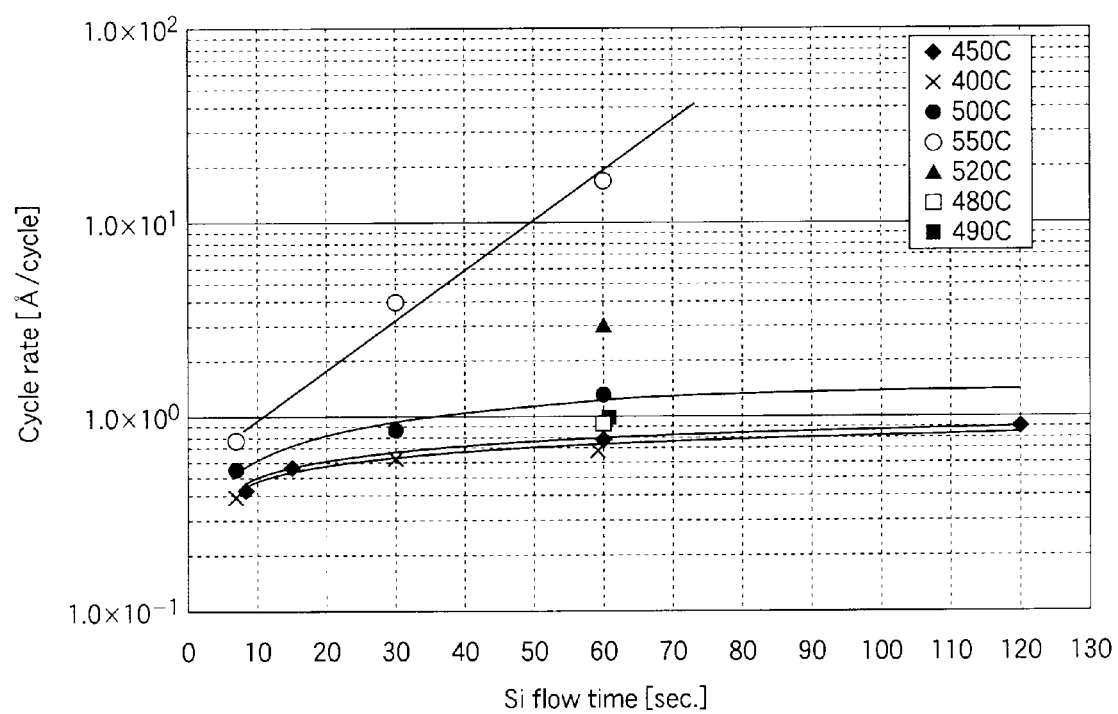
FIG. 5 is a graph showing the relationship of cycle rates expressed in logarithm at respective temperatures relative to the Si source flow time in cases where DCS was used as the Si source.

FIG. 5 is a graph showing the relationship of cycle rates expressed in logarithm at respective temperatures relative to the Si source flow time in cases where DCS was used as the Si source. In FIG. 5, the horizontal axis denotes the Si source flow time and the vertical axis denotes the cycle rate expressed in logarithm.

As shown in FIG. 4, where the film formation temperature was set at 600° C., the cycle rate obtained by MCS was far higher than that obtained by DCS. As shown in FIG. 5, where the film formation temperature was set at 550° C., the cycle rate obtained by MCS was quickly increased with an increase in the flow time. If the cycle rate is quickly increased depending on the flow time, it becomes difficult to control the film thickness, and particularly the uniformity of the film thickness among the wafers of the same batch. Where the film formation temperature was lower than 550° C., the cycle rate obtained by MCS was almost equal to or lower than that obtained by DCS. Where the film formation temperature was set at 550° C., it was possible to realize plasma ALD using DCS. In light of the matters described above, the upper limit of the film formation temperature for using MCS has been determined to be 550° C.

However, ALD is preferably performed in a range where the film thickness is less variable with time, for the film thickness controllability. Further, ALD is ideally performed in the saturation ALD range where the film thickness is essentially not variable with time. In light of these matters, the film formation temperature for using MCS is preferably set to be 520° C. or less, as shown in FIG. 5.

FIG. 6 is a graph showing the relationship of cycle rates relative to the film formation temperature in cases where MCS and DCS were respectively used as the Si source. In FIG. 6, the horizontal axis denotes the film formation temperature, and the vertical axis denotes the cycle rate. As shown in FIG. 6, it has been confirmed that the film formation using MCS can be performed at or above 150° C. Accordingly, the lower limit of the film formation temperature for using MCS has been determined to be 150° C. In order to form a film of higher quality, the film formation temperature is preferably set to be 300° C., or higher and more preferably to be 400° C. or higher.

In the case of the apparatus shown in FIG. 1, in which the plasma generating mechanism 30 is integrally disposed on the process container 1 and the gas distribution nozzles 19 and 22 extending along a plurality of wafers are used to supply process gases, is it possible to attain a higher ALD cycle rate (film formation rate) and higher film quality by use of a lower temperature. For example, as shown in FIGS. 6 and 4, the cycle rates obtained by MCS at process temperatures of lower than 500° C., such as 300° C., 350° C., 400° C., and 450° C., are practically usable. Further, in light of the film thickness controllability in the ALD process, the process temperature is preferably set to be less than 450° C., as shown in FIG. 5.

As described above, the film formation temperature for using MCS is set to fall within a range of 150 to 550° C. Where the film quality and film formation rate are given weight, the film formation temperature is preferably set to be 400 to 520° C. Where the film thickness controllability and apparatus burden are given weight while the film quality is maintained to a certain level, the film formation temperature is preferably set to be 150 to 450° C., more preferably to be 200 to 400° C., and further more preferably to be 300 to 400° C. Where the process temperature is set to be 300 to 400° C., the time period T1 of the adsorption step S1 described previously is set to be 2 to 20 sec, and preferably to be 3 to 9 sec. Further, the time period T2 of the nitridation step S2 is set to be 10 to 90 sec, and preferably to be 20 to 70 sec. In this case, T2/T1 is set to be 0.5 to 4.5, and preferably to be 2.2 to 23.

Figure 7:
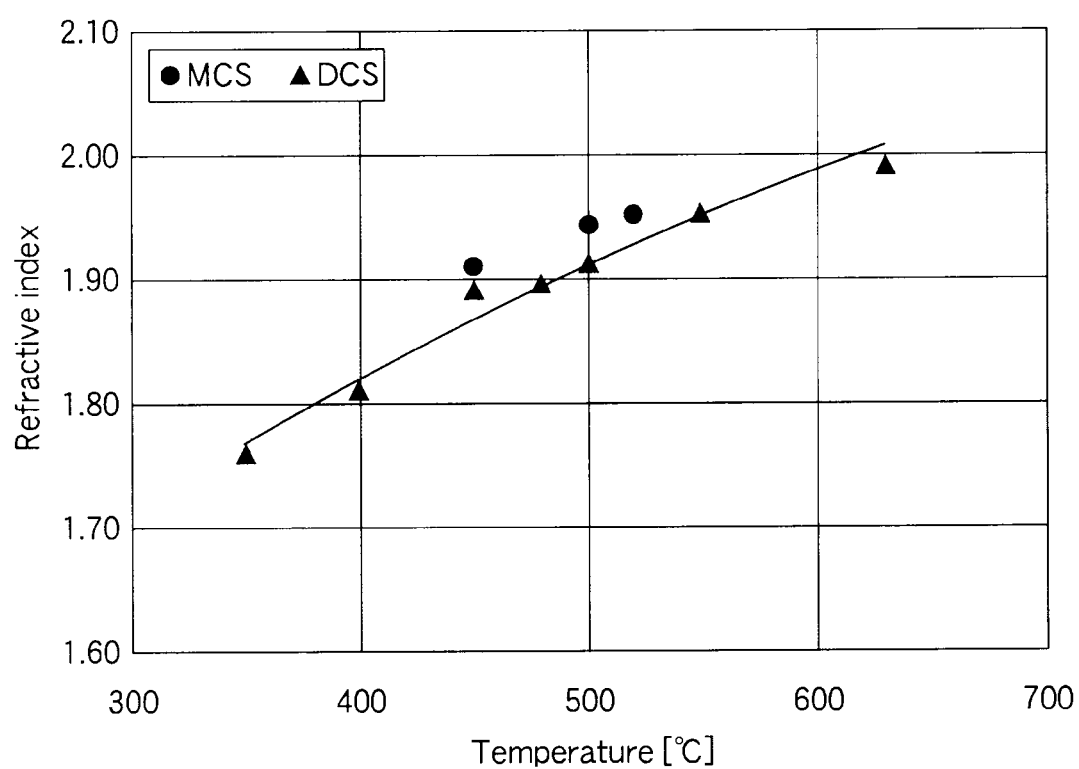
FIG. 7 is a graph showing the relationship of the refractive index of SiN films relative to the film formation temperature in cases where MCS and DCS were respectively used as the Si source.

FIG. 7 is a graph showing the relationship of the refractive index of SiN films relative to the film formation temperature in cases where MCS and DCS were respectively used as the Si source. In FIG. 7, the horizontal axis denotes the film formation temperature, and the vertical axis denotes the refractive index. Where the SiN film ($Si_3N_4$) is stoichiometric, the film has a refractive index of 2. Thus, as the refractive index of a formed SiN film is closer to 2, the film is closer to the stoichiometric SiN film. As shown in FIG. 7, SiN films formed by use of MCS were closer to the stoichiometric SiN film, as compared to SiN films formed by use of DCS under the same film formation conditions. Accordingly, it is thought that MCS can be used as an Si source more easily nitrided and thus allows the film formation to be realized at a lower temperature, as compared to DCS.

As described above, MCS is an Si source more easily nitrided and allows an SiN film of higher film quality to be formed by film formation at a lower temperature. Further, MCS has a Cl content per molecule lower than DCS, and results in a smaller Cl residual amount even in film formation at a lower temperature. Accordingly, SiN films formed by use of MCS render a higher resistance to chemical solutions, as compared to SiN films formed by use of DCS under the same film formation conditions, and further render a smaller decrease in chemical solution resistance along with a decrease in film formation temperature.

Figure 8:
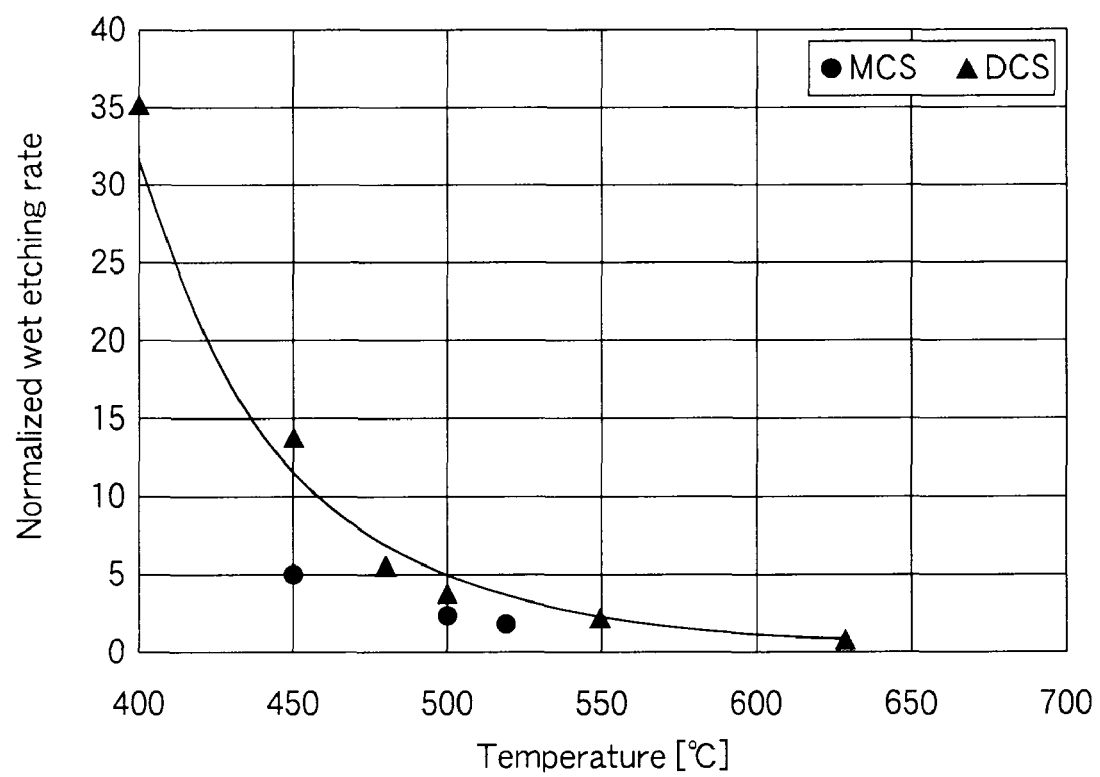
FIG. 8 is a graph showing the relationship of the etching rate of SiN films obtained by diluted hydrofluoric acid (1% DHF) relative to the film formation temperature in cases where MCS and DCS were respectively used as the Si source.

FIG. 8 is a graph showing the relationship of the etching rate of SiN films obtained by diluted hydrofluoric acid (1% DHF) relative to the film formation temperature in cases where MCS and DCS were respectively used as the Si source. This diluted hydrofluoric acid (100:1 DHF) is a chemical solution generally used for wet etching. In FIG. 8, the horizontal axis denotes the film formation temperature, and the vertical axis denotes the etching rate normalized as follows. The normalized etching rate is expressed by values relative to an etching rate (used as 1) obtained by the diluted hydrofluoric acid (100:1 DHF) on an SiN film formed at 760° C. by use of DCS. As shown in FIG. 8, in the case of DCS used for the Si source, where the film formation temperature was lower than 500° C., the chemical solution resistance was sharply deteriorated. On the other hand, in the case of MCS used for the Si source, even where the film formation temperature was 450° C., the chemical solution resistance was still good.

Where the film formation is performed at a low temperature of lower than 500° C. by use of DCS as the Si source, the outermost surface of the SiN film thus formed can be easily oxidized. On the other hand, where the film formation is performed at such a low temperature by use of MCS as the Si source, the oxidation resistance of the film surface is remarkably improved. The oxidation of the outermost surface is caused by moisture or the like contained in air when the wafers are unloaded. The oxidation of the outermost surface can be expressed by a difference ($R_S$–$R_B$) between a wet etching rate ($R_S$) of the outermost surface and a wet etching rate ($R_B$) of the film matrix (bulk).

Figure 9:
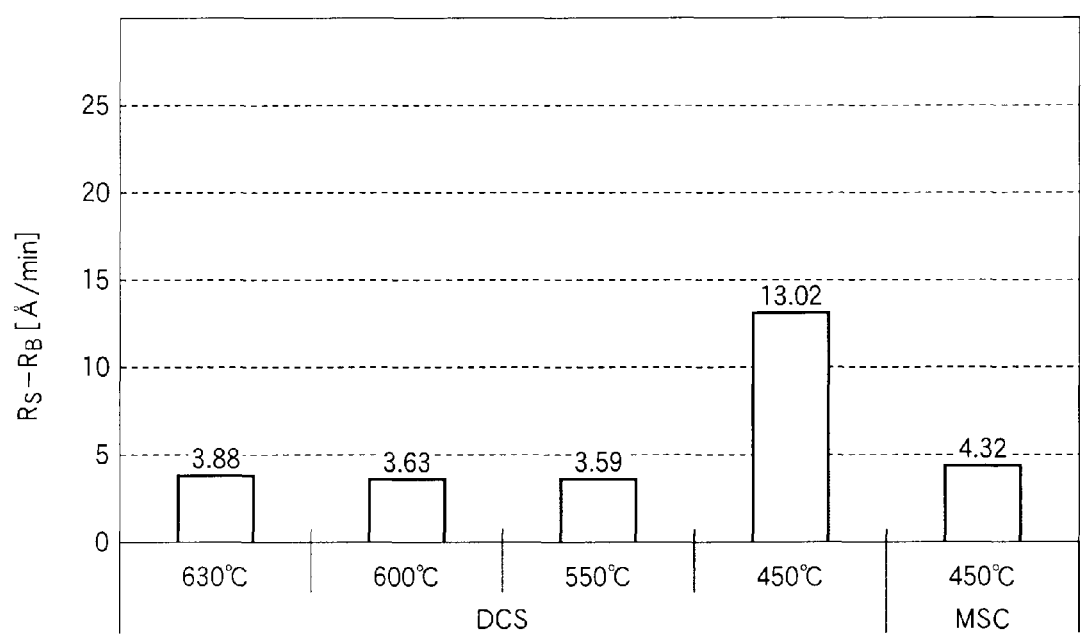
FIG. 9 is a graph showing the oxidation resistance of the outermost surface of SiN films in cases where films were formed at 450° C., 550° C., 600° C., and 630° C. by use of DCS and a film was formed at 450° C. by use of MCS.

FIG. 9 is a graph showing the oxidation resistance of the outermost surface of SiN films in cases where films were formed at 450° C., 550° C., 600° C., and 630° C. by use of DCS and a film was formed at 450° C. by use of MCS. FIG. 9 shows the oxidation resistance of these films by $R_S$–$R_B$ values. As shown in FIG. 9, where DCS was used, the $R_S$–$R_B$ value was very large at a film formation temperature of 450° C. Where MCS was used, the $R_S$–$R_B$ value or oxidation resistance of the film formed at a film formation temperature of 450° C. was close to those of films formed at film formation temperatures of 550° C. or higher by use of DCS. It is thought that this was because MCS has a Cl content per molecule lower than DCS, and results in a smaller concentration of chlorine remaining in the surface.

Incidentally, after the film formation process described above is repeated for a predetermined number of batches of wafers W, a cleaning process is performed. In the cleaning process, the wafer boat 5 without product wafers supported thereon is placed on the heat-insulating cylinder 7 and is loaded from below into the process container 1 heated at a predetermined temperature. Then, the bottom port of the manifold 3 is closed by the lid 9 to set an airtight space inside the process container 1. Then, a cleaning gas, such as a fluorine-containing gas, e.g., HF gas or $F_2$ gas, is supplied into the process container 1 while the interior of the process container 1 is vacuum-exhausted.

This cleaning process removes reaction products deposited on the inner surface of the process container 1, wafer boat 5, heat-insulating cylinder 7, and gas distribution nozzles 19 and 22. The temperature in the process container 1 during the cleaning process is preferably set to be 300 to 500° C., and more preferably 300 to 450° C. For the cleaning process, as shown in FIG. 1 by phantom lines, a cleaning gas supply mechanism 41 may be connected to the process container 1. The cleaning gas supply mechanism 41 includes a gas supply source 42 of the cleaning gas and a gas line 43 extending from the gas supply source 42. The gas line 43 forks on the way to two lines connected to the gas line 18 and gas line 21.

After the cleaning process and before the next film formation process, a coating process is performed inside the process container 1, accommodating the heat-insulating cylinder 7 and the wafer boat 5 placed thereon without product wafers supported thereon, to cover the inner surface of the process container, the surface of the wafer boat, and so forth. This is conceived to prevent particles and contaminants, such as Na, from scattering from theses members (made of quartz) and contaminating the product film. Conventionally, in film formation apparatuses for forming a product film by plasma ALD, a coating process of this kind is also performed by plasma ALD using the same process gases as the film formation process, to simplify the control and increase the yield.

However, where a coating film is formed by plasma ALD using MCS, Na contamination is more easily caused on the product film, as compared to a case using DCS. It is thought that this is caused due to the fact that, where a film is formed by use of MCS, the chlorine (derived from the Si source gas) concentration in the film becomes lower, as described above. In other words, the concentration of chlorine present as a contaminant in the product film should be lower as a matter of course in light of the semiconductor device performance, while the concentration of chlorine of the coating film is preferably set to have a certain level to provide an Na trapping effect.

The present inventors further proceeded with studies in this respect, and have found that, where MCS is used as the Si source gas, it is preferable to perform the coating process by thermal ALD even where the product film is formed by plasma ALD. Where the coating process is performed by thermal ALD, the chlorine concentration in the coating film is increased while the coating film is formed to have a sufficient thickness from the bottom to the top inside the process container 1.

Figure 10:
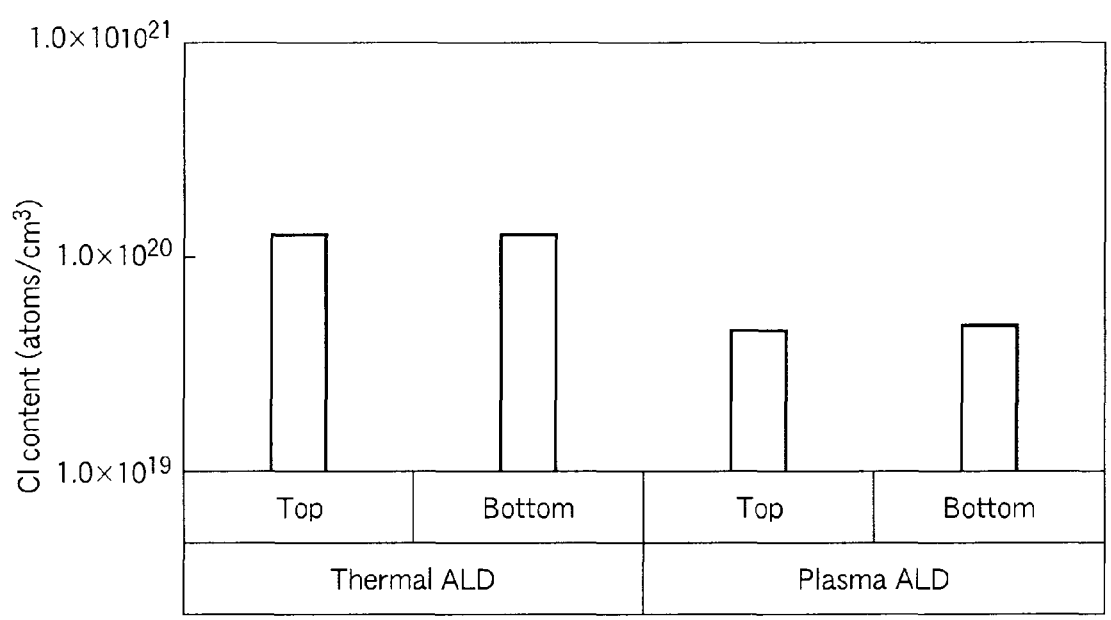
FIG. 10 is a graph showing the Cl content in SiN films formed by plasma ALD and thermal ALD.

FIG. 10 is a graph showing the Cl content in SiN films formed by plasma ALD and thermal ALD. This data was obtained by using DCS as the Si source gas, but a result of the same kind was confirmed also in cases using MCS. As shown in FIG. 10, depending on the presence and absence of plasma, the Cl concentration clearly shows a significant difference. Since a film formed by thermal ALD has a higher Cl concentration, it is expected that the Na trapping effect of Cl is enhanced by performing the coating process by thermal ALD.

Specifically, this thermal ALD is performed by alternately repeating an adsorption step of supplying the MCS gas and a nitridation step of supplying the nitriding gas in the same manner as the timing chart shown in FIG. 3 except for plasma generation. The adsorption step is arranged to supply the Si source gas or MCS gas into the process container 1 to adsorb this gas on the inner surface of the process container 1 and so forth. The nitridation step is arranged to supply the nitriding gas or $NH_3$ gas not excited by plasma into the process container 1 to nitride the Si source gas adsorbed on the inner surface of the process container 1 and so forth. Purge steps are interposed between the adsorption step and nitridation step to remove residual gas from inside the process container 1.

In this coating process, the heating temperature inside the process container 1 is set higher than that of the film formation process. Specifically, the heating temperature is set to be 300 to 630° C., and preferably to be 500 to 630° C. The other conditions may be set almost the same as those of the plasma ALD for forming the product film. Further, the time periods of the steps of the coating process may be set almost the same as those of the film formation process, but the purge steps may be shorter.

The present invention is not limited to the embodiment described above, and it may be modified in various manners. For example, in the embodiment described above, the present invention is applied to a film formation apparatus of the batch type that performs a film formation process on a plurality of semiconductor wafers together at a time. Alternatively, the present invention may be applied to a film formation apparatus of the single-substrate type that performs a film formation process on wafers one by one.

In the embodiment described above, the nitriding gas or nitrogen-containing gas is $NH_3$ gas. Alternatively, as described above, another nitrogen-containing gas, such as $N_2$ gas or $N_2H_4$ gas, may be used.

In the embodiment described above, the plasma generation mechanism is integrally disposed on the process container. Alternatively, the present invention is applied to a remote plasma apparatus equipped with a plasma generation mechanism disposed separately from the process container to turn the nitrogen-containing gas into plasma outside the process container before supplying the gas into the process container.

In the embodiment described above, the nitrogen-containing gas or $NH_3$ gas is excited by plasma, but the nitrogen-containing gas may be used without plasma excitation, depending on its type.

In the embodiment described above, the MCS gas and $NH_3$ gas are completely alternately supplied. However, they do not necessarily need to be completely alternately supplied, such that the $NH_3$ gas is also supplied while the MCS gas is supplied.

The target object is not limited to a semiconductor wafer, and the present invention may be applied to another substrate, such as an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for forming a silicon nitride film on a plurality of target objects placed at intervals in a vertical direction inside a process container configured to be selectively supplied with monochlorosilane gas serving as a Si source and ammonia gas serving as a nitriding gas and equipped with a plasma generating mechanism disposed on a sidewall of the process container to turn into plasma the ammonia gas being supplied, the process container including an inner surface made of quartz, from which Na can be released as a contaminant, the method comprising:

performing a coating process inside the process container, without the product target objects placed therein, to cover the inner surface of the process container with a coating film; and then performing a film formation process to form the silicon nitride film on the target objects placed inside the process container, the coating process and the film formation process respectively forming the coating film and the silicon nitride film to have a predetermined thickness by repeating a cycle a plurality of times to laminate thin films respectively formed by the plurality of times, the cycle comprising:

a first supply step of supplying the monochlorosilane gas into the process container by spouting the monochlorosilane gas in horizontal directions from a plurality of gas spouting holes formed on a first nozzle extending vertically without supplying the ammonia gas into the process container, thereby forming an adsorbed layer derived from the monochlorosilane gas;

then a first purge step of exhausting gas from inside the process container without supplying either of the monochlorosilane gas and the ammonia gas into the process container;

then a second supply step of supplying the ammonia gas into the process container by spouting the ammonia gas in horizontal directions from a plurality of gas spouting holes formed on a second nozzle extending vertically without supplying the monochlorosilane gas into the process container, thereby nitriding the adsorbed layer; and then a second purge step of exhausting gas from inside the process container without supplying either of the monochlorosilane gas and the ammonia gas into the process container, wherein the coating process forms the coating film in a thermal atomic layer deposition (ALD) manner by setting the process container at a coating temperature during the cycle, and supplying the monochlorosilane gas and the ammonia gas into the process container without turning either of the monochlorosilane gas and the ammonia gas into plasma, wherein the film formation process forms the silicon nitride film in a plasma ALD manner by setting the process container at a film formation temperature of 300 to 450° C. during the cycle, in which the first supply step is a step of supplying the monochlorosilane gas into the process container without turning the monochlorosilane gas into plasma while setting the process container at a pressure of 66.65 to 666.5 Pa therein, and the second supply step is a step of supplying the ammonia gas into the process container while turning the ammonia gas into plasma by the plasma generating mechanism and setting the process container at a pressure of 13.33 to 266.6 Pa therein, and wherein the coating process uses conditions, including the coating temperature being a temperature of 500 to 630° C. and higher than the film formation temperature, to set a concentration of chlorine in the coating film at a level higher than that in the silicon nitride film, the chlorine being derived from the monochlorosilane gas and serving to trap the Na.

2. The method according to claim 1, wherein the film formation temperature is a temperature of 300 to 400° C.

3. The method according to claim 2, wherein, where the first supply step has a time period T1 and the second supply step has a time period T2, a ratio of T2/T1 is set to be 0.5 to 45.

* * * * *